(12) United States Patent
Chiu et al.

(10) Patent No.: US 12,237,190 B2
(45) Date of Patent: Feb. 25, 2025

(54) SUPPORTING SHELF MODULE AND WAFER CONTAINER USING SAME

(71) Applicant: GUDENG PRECISION INDUSTRIAL CO., LTD., New Taipei (TW)

(72) Inventors: Ming-Chien Chiu, New Taipei (TW); En-Nien Shen, New Taipei (TW); Yung-Chin Pan, New Taipei (TW); Cheng-En Chung, New Taipei (TW); Po-Ting Lee, New Taipei (TW); Wei-Chien Liu, New Taipei (TW); Tzu-Wei Huang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 199 days.

(21) Appl. No.: 17/406,116

(22) Filed: Aug. 19, 2021

(65) Prior Publication Data
US 2022/0093434 A1 Mar. 24, 2022

Related U.S. Application Data

(60) Provisional application No. 63/081,902, filed on Sep. 22, 2020.

(51) Int. Cl.
*H01L 21/673* (2006.01)
*B65D 21/02* (2006.01)
(Continued)

(52) U.S. Cl.
CPC .... *H01L 21/67309* (2013.01); *B65D 21/0204* (2013.01); *B65D 21/0213* (2013.01);
(Continued)

(58) Field of Classification Search
CPC ......... H01L 21/67309; H01L 21/67017; H01L 21/67346; H01L 21/67373;
(Continued)

(56) References Cited

U.S. PATENT DOCUMENTS 6,092,981 A * 7/2000 Pfeiffer ............. H01L 21/67313
211/41.18
7,909,166 B2 * 3/2011 Lin ................... H01L 21/67373
220/323

(Continued)

FOREIGN PATENT DOCUMENTS

| JP | H11204629 A | 7/1999 |
| JP | 2003068841 A | 3/2003 |
| JP | 2013119430 A | 6/2013 |

*Primary Examiner* — Andrew D Perreault (57) ABSTRACT

A supporting shelf module includes a plurality of plastic supporting plates parallelly arranged in a height direction, and at least one pair of metal-made connectors located at two opposite ends of the supporting plates in the height direction. The connectors in one pair are correspondingly located in two horizontal planes perpendicular to the height direction. A wafer container is also disclosed, which includes a container body having at least two sets of the supporting shelf modules mounted therein, at least two top retaining brackets and at least two bottom retaining grooves provided on an inward side of a top and a bottom panel of the container body, respectively. The supporting shelf module has upper ends engaged with the top retaining brackets and lower ends engaged with and limited to the bottom retaining grooves in an engaging direction. Thus, the tolerance problem of the conventional wafer shelf can be solved.

8 Claims, 7 Drawing Sheets

(51) Int. Cl.
*B65D 21/08* (2006.01)
*B65D 25/10* (2006.01)
*B65D 47/32* (2006.01)
*H01L 21/67* (2006.01)
*H01L 21/677* (2006.01)

(52) U.S. Cl.
CPC ....... *B65D 21/0228* (2013.01); *B65D 21/083* (2013.01); *B65D 25/107* (2013.01); *B65D 47/32* (2013.01); *H01L 21/67017* (2013.01); *H01L 21/67346* (2013.01); *H01L 21/67373* (2013.01); *H01L 21/67393* (2013.01); *H01L 21/67742* (2013.01); *B65D 2205/02* (2013.01); *B65G 2201/0235* (2013.01); *B65G 2201/0297* (2013.01)

(58) Field of Classification Search
CPC ......... H01L 21/67393; H01L 21/67742; H01L 21/67386; H01L 21/6732; H01L 21/67376; H01L 21/67383; B65D 21/0204; B65D 21/0213; B65D 21/0228; B65D 21/083; B65D 25/107; B65D 47/32; B65D 2205/02; B65D 81/18; B65D 85/48; B65G 2201/0235; B65G 2201/0297
USPC .......................................................... 206/710
See application file for complete search history.

(56) References Cited

U.S. PATENT DOCUMENTS

| | | | | |
|---|---|---|---|---|
| 8,365,919 | B2* | 2/2013 | Nakayama | H01L 21/67383 206/711 |
| 10,475,682 | B2* | 11/2019 | Fuller | H01L 21/67383 |
| 2004/0069728 | A1* | 4/2004 | Huang | H01L 21/6734 211/41.18 |
| 2006/0283771 | A1* | 12/2006 | Park | H01L 21/67373 206/832 |
| 2021/0061517 | A1* | 3/2021 | Nakayama | B65D 85/48 |

* cited by examiner

SUPPORTING SHELF MODULE AND WAFER CONTAINER USING SAME

CROSS-REFERENCE TO RELATED APPLICATION

This non-provisional application claims priority under 35 U.S.C. § 119(e) on U.S. provisional Patent Application No. 63/081,902 filed on Sep. 22, 2020, the entire contents of which are hereby incorporated by reference.

BACKGROUND OF THE INVENTION

1. Field of the Invention

The present disclosure relates to a wafer carrier, and more particularly, to a supporting shelf module that enables reduced manufacturing cost and tolerance, and also relates to a wafer container using the supporting shelf module.

2. Description of the Related Art

In a conventional wafer container, there is a plurality of supporting shelves mounted to two opposite sides of the wafer container for correspondingly supporting a plurality of wafers at two opposite sides of the wafers. Conventionally, wafer containers for differently sized wafers require differently configured supporting shelves. That is, differently configured supporting shelves are adapted only to wafer containers particularly designed for them, which leads to high production cost. Taiwan Invention Patent No. 1702677 discloses a supporting shelf that is assembled by stacking a plurality of shelf parts. The parts for this type of supporting shelf must be produced by injection molding to reduce their weight. However, the injection molded parts also have relatively large tolerance, which tends to result in difficulty in subsequent assembling operation. In some worse conditions, the large tolerance even prevents the parts from being successful assembled for use.

BRIEF SUMMARY OF THE INVENTION

An objective of the present disclosure is to solve the problems in the conventional wafer containers and wafer supporting shelves by providing a supporting shelf module that enables reduced manufacturing cost and tolerance, and by providing a wafer container using the supporting shelf module.

To achieve at least the above objective, the supporting shelf module according to the present disclosure includes a plurality of supporting plates parallelly arranged in a height direction; and at least one pair of connectors located at two opposite ends of the supporting plates in the height direction. The supporting plates are made of a plastic material, the connectors are made of a metal material, and the connectors in one pair are located correspondingly in two horizontal planes that are perpendicular to the height direction.

In an embodiment, the connectors in one pair include a male connector and a female connector; and the male and the female connector are corresponding in shape.

In an embodiment, the supporting shelf module further includes an embedded metal part for extending through the supporting plates; and the connectors in one pair are two ends of the embedded metal part.

In an embodiment, the supporting shelf module further includes at least one metal post. The embedded metal part is a hollow member, and the metal post is axially extended through the embedded metal part.

In an embodiment, each of the supporting plates has a rib provided on each of two opposite ends thereof.

To achieve at least the above objective, the wafer container according to the present disclosure includes a container body; at least two sets of the above described supporting shelf modules separately mounted in the container body and located adjacent to two opposite side panels of the container body; at least two top retaining brackets separately provided on an inward side of a top panel of the container body and respectively having a sideward opening, via which upper ends of the supporting shelf modules moved in an engaging direction can engage with the top retaining brackets; and at least two bottom retaining grooves separately provided on an inward side of a bottom panel of the container body, and lower ends of the supporting shelf modules are moved in the engaging direction to engage with and be limited to the bottom retaining grooves.

In an embodiment, the bottom retaining grooves respectively have a width that gradually reduces in the engaging direction.

In an embodiment, the top retaining brackets respectively have two elastically outward extended wing portions; and the two wing portions define the sideward opening between them.

In an embodiment, the wafer container further includes four sets of door latching devices provided on a front door of the container body. Each set of the door latching device includes a cam and two latches. The two latches are located perpendicular to each other and respectively have an end connected to the cam and another end interfered with the top panel, the bottom panel or one of the two side panels of the container body.

In an embodiment, the cam has at least one protruded section, which lifts and presses against the end of the latch that is connected to the cam, such that the latch is brought to turn pivotally.

In the present disclosure, a plurality of supporting plates is assembled to one another to provide a modularized supporting shelf, i.e. a supporting shelf module, which has the advantages of requiring reduced manufacturing cost, forming a general part proving increased degrees of freedom in use, and having metal connectors that have reduced manufacturing tolerance, assembling tolerance, and upgraded manufacturing precision.

DETAILED DESCRIPTION OF THE INVENTION

To facilitate understanding of the objects, characteristics and effects of this present disclosure, an embodiment together with the attached drawings for the detailed description of the present disclosure are provided. It is noted the present disclosure can be implemented or applied in other embodiments, and many changes and modifications in the described embodiment can be carried out without departing from the spirit of the disclosure, and it is also understood that the preferred embodiment is only illustrative and not intended to limit the present disclosure in any way.

Figure 1:
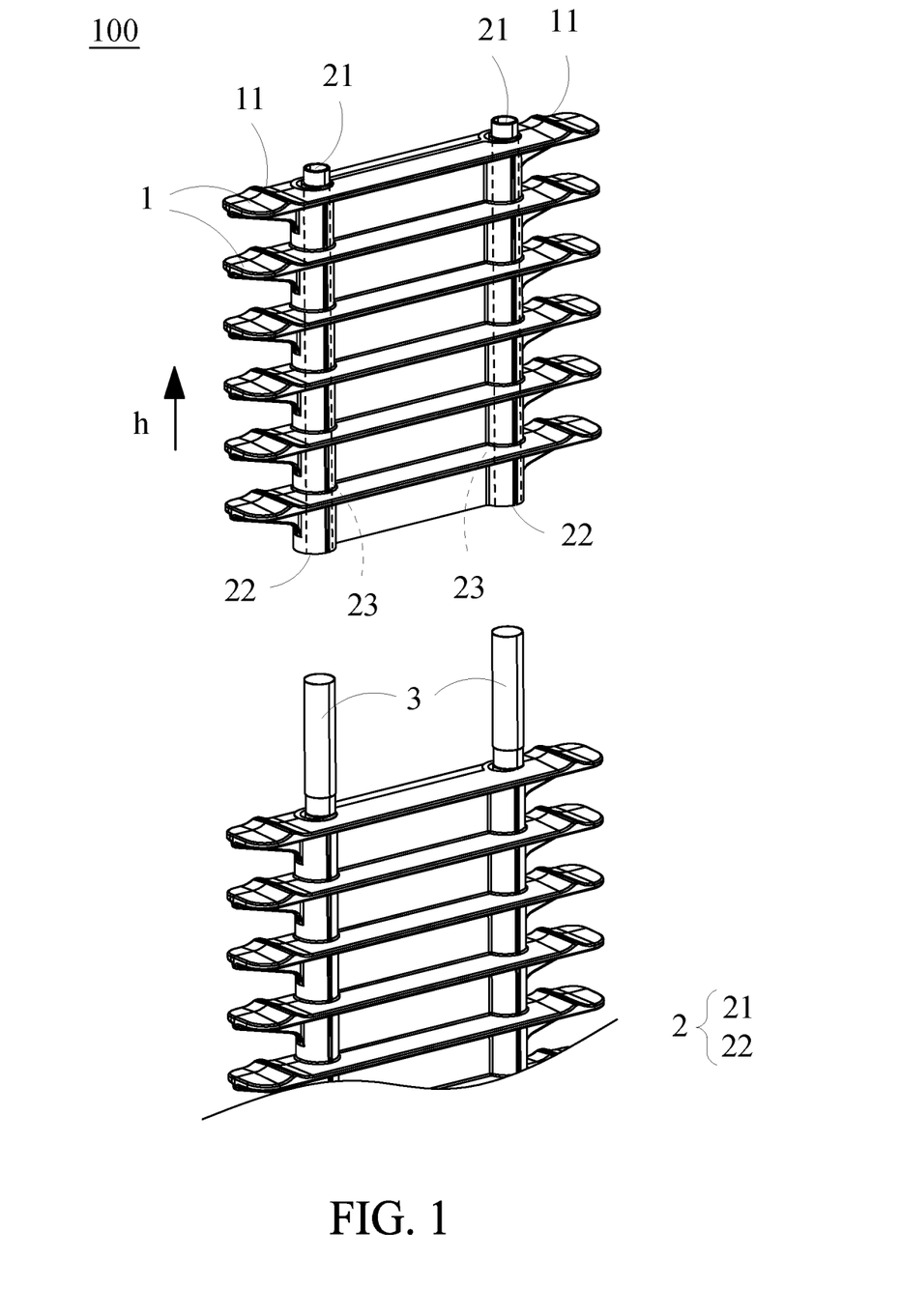
FIG. 1 is a perspective view showing a supporting shelf module according to a preferred embodiment of the present disclosure.
Figure 2:
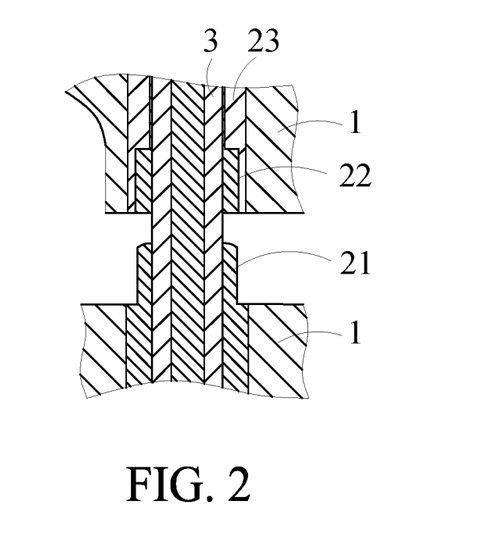
FIG. 2 is a fragmentary, sectional view of the supporting shelf module according to the preferred embodiment of the present disclosure shown in FIG. 1.

As shown in FIGS. 1 and 2, a supporting shelf module 100 according to a preferred embodiment of the present disclosure includes a plurality of supporting plates 1 and at least one pair of connectors 2.

The supporting plates 1 are parallelly arranged in a height direction h. Each of the supporting plates 1 can support a wafer (not shown) or other flat sheet-shaped object. The number of the supporting plates 1 included in one supporting shelf module 100 is not particularly limited. In the illustrated preferred embodiment, every supporting shelf module 100 includes six supporting plates 1. However, in other embodiments, the number of the supporting plates 1 included in one supporting shelf module 100 can be different from the illustrated embodiment. Each of the supporting plates 1 has a rib 11 provided on each of two opposite ends thereof. The rib 11 is raised from an upper surface of the supporting plate 1, and the wafer is supported on the ribs 11 with minimal contact surfaces between the wafer and the supporting plate 1. The supporting plate 1 can be made of a plastic material and is preferably formed through a plastic injection molding process, because the plastic supporting plates 1 have the advantages of quick manufacturing speed, low manufacturing cost and low weight, and is more suitable for use with a large-scale wafer container.

The at least one pair of connectors 2 is located at two opposite ends of the supporting plates 1 in the height direction h. The connectors 2 are made of a metal material. The conductors 2 included in one pair are located correspondingly in two horizontal planes that are perpendicular to the height direction h. That is, the connectors 2 included in one pair are vertically located corresponding to each other.

Figure 3:
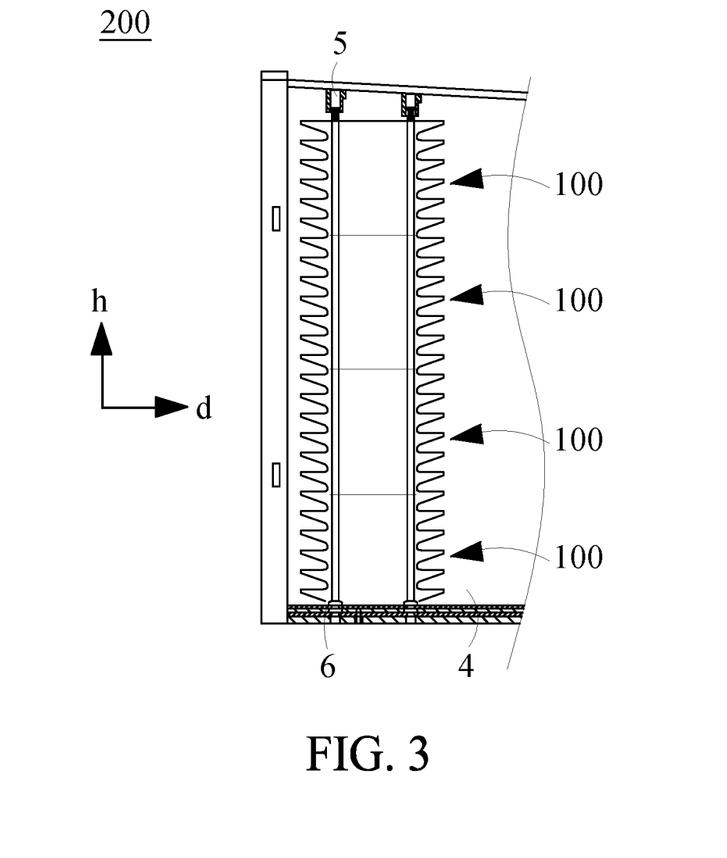
FIG. 3 is a sectional view of a wafer container according to a preferred embodiment of the present disclosure.

In the illustrated preferred embodiment, the supporting shelf module 100 includes two pairs of connectors 2. However, in other embodiments, there can be only one pair or more pairs of the connectors 2. The connectors 2 in one pair include a male connector 21 and a female connector 22, which are corresponding in shape. In other words, the male connector 21 of one supporting shelf module 100 can be telescoped into the female connector 22 of another supporting shelf module 100. By stacking a plurality of supporting shelf modules 100 in the height direction h, as shown in FIG. 3, supporting shelves of different heights can be formed to adapt to differently sized wafer containers. In other words, the supporting shelf module 100 includes a plurality of supporting plates 11, which are assembled together to form a module that can be manufactured at reduced cost because it is not necessary to make a specific supporting shelf mold for each of the differently sized wafer containers. In this way, the supporting shelf module 100 becomes a general part providing increased degrees of freedom in use. And, the metal connectors 2 can be produced with a reduced manufacturing tolerance, a reduced assembling tolerance and upgraded manufacturing precision, because a metal product usually has a tolerance largely smaller than that of a plastic injection molded product. It is understood the present disclosure is not limited to the above embodiment. In other embodiments, only one supporting shelf module 100 can be used alone without assembling it to other supporting shelf modules 100 while the low manufacturing tolerance and upgraded manufacturing precision can still be achieved through the use of the metal connectors 2.

In the illustrated preferred embodiment, the supporting shelf module 100 further includes an embedded metal part 23 that extends through the plurality of supporting plates 1. The connectors 2 in one pair or the male connector 21 and the female connector 22 in pair are actually two ends of the embedded metal part 23. In other words, the metal connectors 2 can be separately located at two vertically opposite ends of the supporting plates 1, or can be separately embedded in an upper and a lower end of the embedded metal part 23 of the supporting plates 1.

As shown in FIGS. 1 and 2, the supporting shelf module 100 in the illustrated preferred embodiment further includes at least one metal post 3. The embedded metal part 23 is a hollow member and the metal post 3 is extended through the embedded metal part 23. The metal post 3 can be used to serially connect a plurality of supporting shelf modules 100 to one another with upper and lower ends of the metal post 3 fixedly connected to a container body 4, as shown in FIG. 3. In the illustrated preferred embodiment, the metal post 3 is a round post. However, the present disclosure is not limited thereto, and the metal post 3 can be otherwise a polygonal post.

As shown in FIGS. 3 to 7, the present disclosure also provides a wafer container 200, which includes a container body 4, at least two sets of the supporting shelf modules 100, at least two top retainer brackets 5, and at least two bottom retaining grooves 6.

In the container body 4, at least two sets of the supporting shelf modules 100 are mounted to two opposite sides of the container body 4. More specifically, the two sets of supporting shelf modules 100 are separately mounted adjacent to two opposite side panels 44 of the container body 4, such that two lateral ends of the supporting plates 1 included in each set of the supporting shelf module 100 are well supported. One or more sets of the supporting shelf modules 100 can be mounted adjacent to each of the two side panels 44 of the container body 4. In the case of having multiple sets of the supporting shelf modules 100 mounted adjacent to each side panel 44, the supporting shelf modules 100 are stacked in the height direction h.

Figure 5:
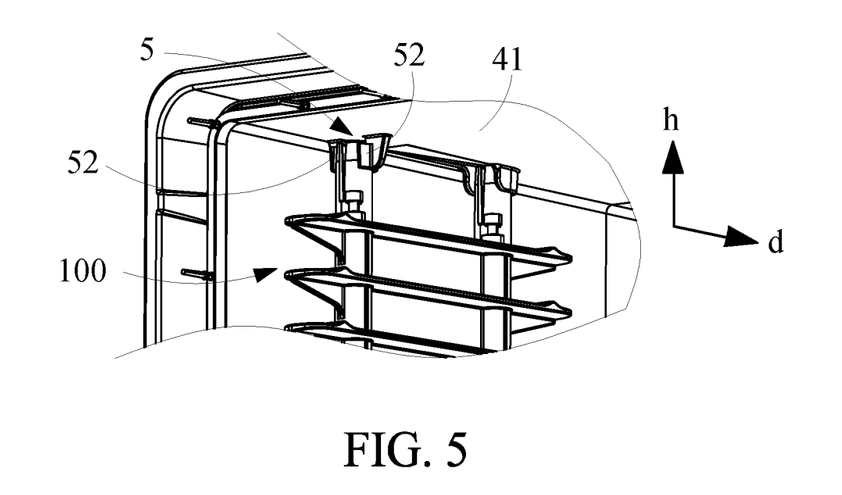
FIG. 5 is a fragmentary, enlarged perspective view of the wafer container according to the preferred embodiment of the present disclosure shown in FIG. 4 viewed from another angle thereof.
Figure 6:
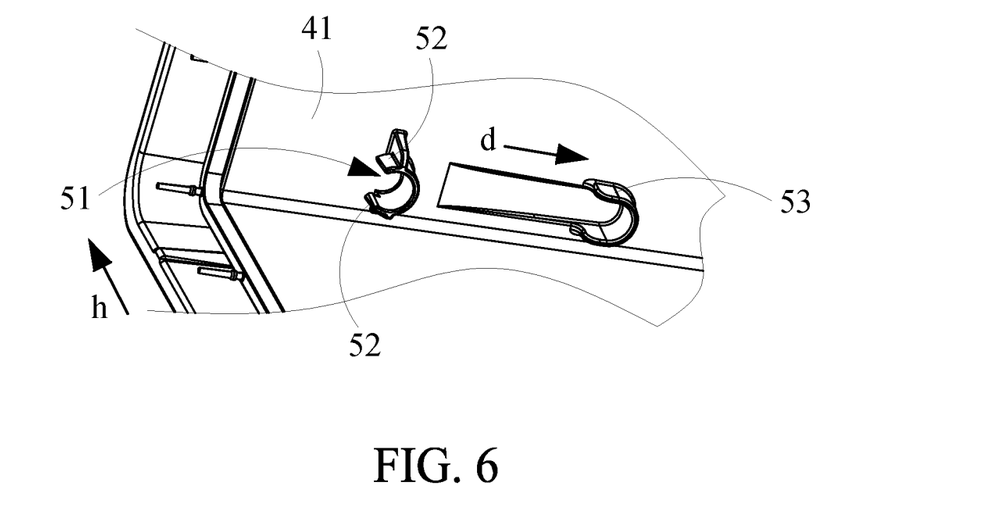
FIG. 6 is a fragmentary, enlarged perspective view of the wafer container according to the preferred embodiment of the present disclosure showing top retaining brackets thereof.

The at least two top retaining brackets 5 are separately provided on an inward side of a top panel 41 of the container body 4. In FIG. 5, there is shown one set of two top retaining brackets 5 provided in the container body 4 adjacent to one side thereof. There is another set of the top retaining brackets 5 provided in the container body 4 at an opposite side but is not shown in the drawing. As shown in FIGS. 5 and 6, these top retaining brackets 5 respectively have a sideward opening 51. Upper ends of the supporting shelf module 100 can be moved in an engaging direction d to engage with the set of top retaining brackets 5. In the illustrated preferred embodiment, the engaging direction d is perpendicular to the height direction h and is directed from an opening of the container body 4 toward an interior of the container body 4. However, it is understood the present disclosure is not necessarily limited thereto. Parts of the supporting shelf module 100 for engaging with the top retaining brackets 5 can be the male connectors 21, the female connectors 22, a partial plastic material that is upward extended from a main body of the supporting plate 1 and covers the connectors 2, or the metal posts 3 without particular limitation.

Figure 7:
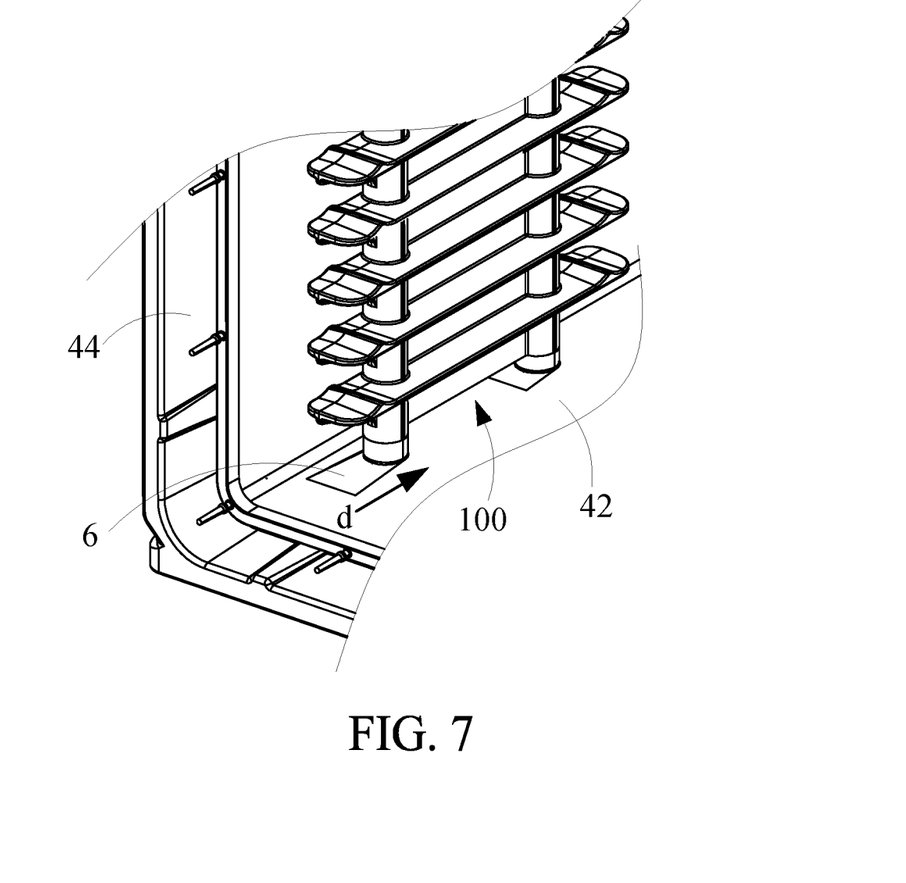
FIG. 7 is a fragmentary, enlarged perspective view of the wafer container according to the preferred embodiment of the present disclosure showing bottom retaining grooves thereof.

The at least two bottom retaining grooves 6 are separately provided on an inward side of a bottom panel 42 of the container body 4. In FIG. 7, there is shown one set of the bottom retaining grooves 6 provided in the container body 4 adjacent to one side thereof. There is another set of the bottom retaining grooves 6 provided in the container body 4 at an opposite side but is not shown in the drawing. As shown in FIG. 7, lower ends of the supporting shelf module 100 can be moved in the engaging direction d to engage with the set of bottom retaining grooves 6. In the illustrated preferred embodiment, the bottom retaining grooves 6 respectively have a width that gradually reduces in the engaging direction d to enable positional limiting of the lower ends of the supporting shelf module 100. After being engaged with the bottom retaining grooves 6, the lower ends of the supporting shelf module 100 can be further located in place using, for example, screws. Parts of the supporting shelf module 100 for engaging with the bottom retaining grooves 6 can be the male connectors 21, the female connectors 22, a partial plastic material that is downward extended from the main body of the supporting plate 1 and covers the connectors 2, or the metal posts 3 without particular limitation.

In the illustrated preferred embodiment, as shown in FIG. 6, the top retaining brackets 5 respectively include two elastically outward extended wing portions 52, which together define the sideward opening 51 between them. The sideward opening 51 is slightly smaller than a width of one upper end of the supporting shelf module 100. When the supporting shelf module 100 is moved in the engaging direction d for its upper ends to approach the sideward openings 51, the upper ends of the supporting shelf module 100 would first contact with and push the wing portions of the top retaining brackets 5 slightly apart elastically. The wing portions 52 automatically elastically return to their original positions when the upper ends of the supporting shelf module 100 are engaged with the top retaining brackets 5.

The top retaining brackets 5 further respectively include a secondary retaining lock 53 for correspondingly receiving the upper ends of the supporting shelf module 100 therein and accordingly, ensuring even secured mounting of the supporting shelf module 100 to the container body 4.

Figure 4:
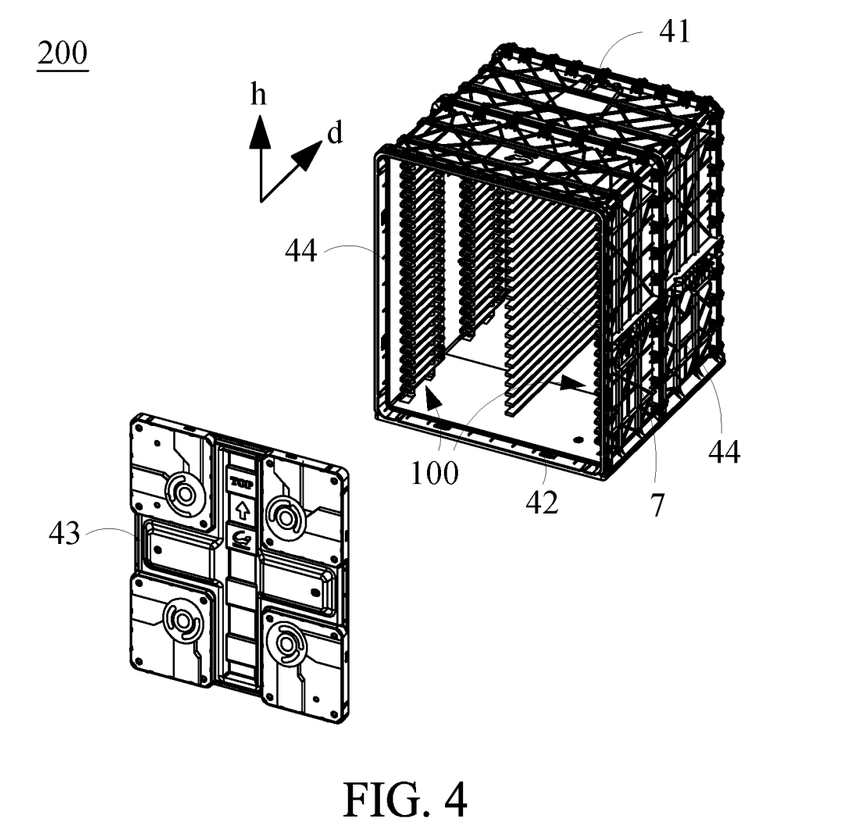
FIG. 4 is a perspective view of the wafer container according to the preferred embodiment of the present disclosure.

In the illustrated preferred embodiment, as shown in FIG. 4, the wafer container 200 further includes a central supporting shelf 7, which is located between the supporting shelf modules 100 mounted to two opposite sides of the container body 4, for supporting a plurality of wafers at their middle areas to protect the wafers from warping.

Figure 8:
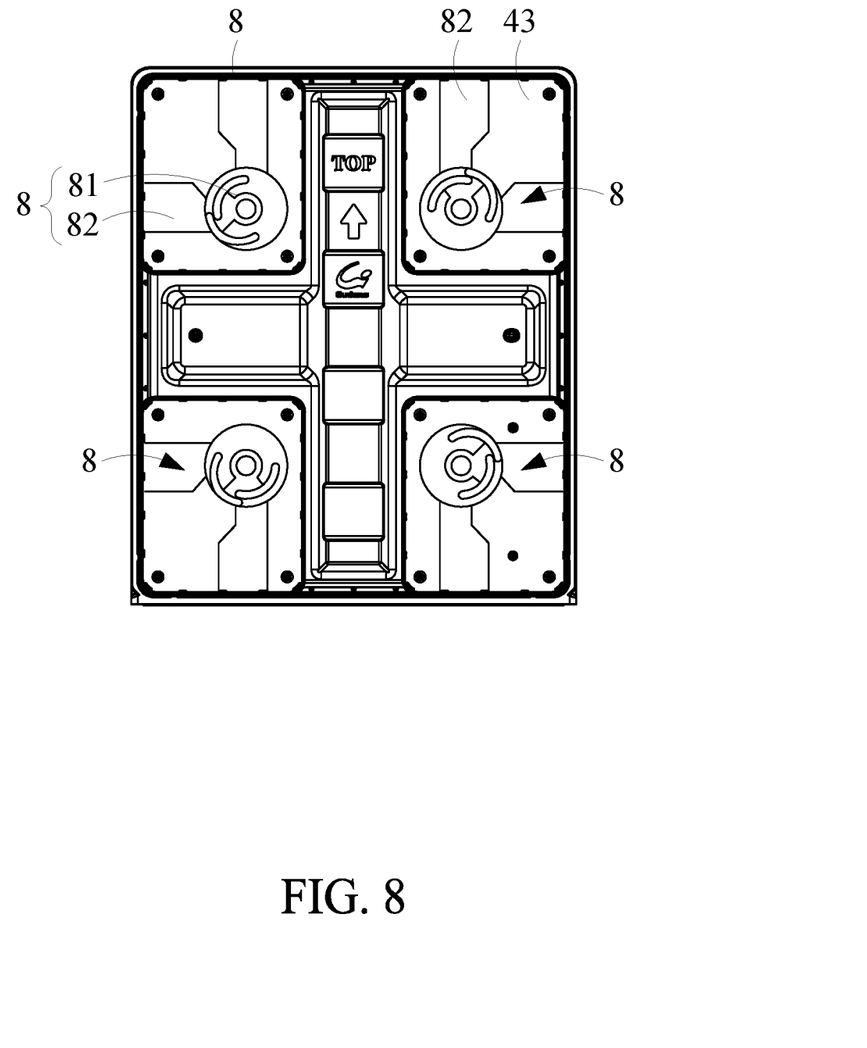
FIG. 8 is a front view of a front door for the wafer container according to the preferred embodiment of the present disclosure.

In the illustrated preferred embodiment, as shown in FIG. 8, the wafer container 200 further includes four sets of door latching devices 8, which are provided on a front door 43 of the container body 4. Each set of the door latching device 8 includes a cam 81 and two latches 82. The two latches 82 are located perpendicular to each other to the cam 81. Every latch 82 has an end connected to the cam 81 and another end interfered with the top panel 41, the bottom panel 42 or one of the two side panel 44 of the container body 4.

Figure 9A:
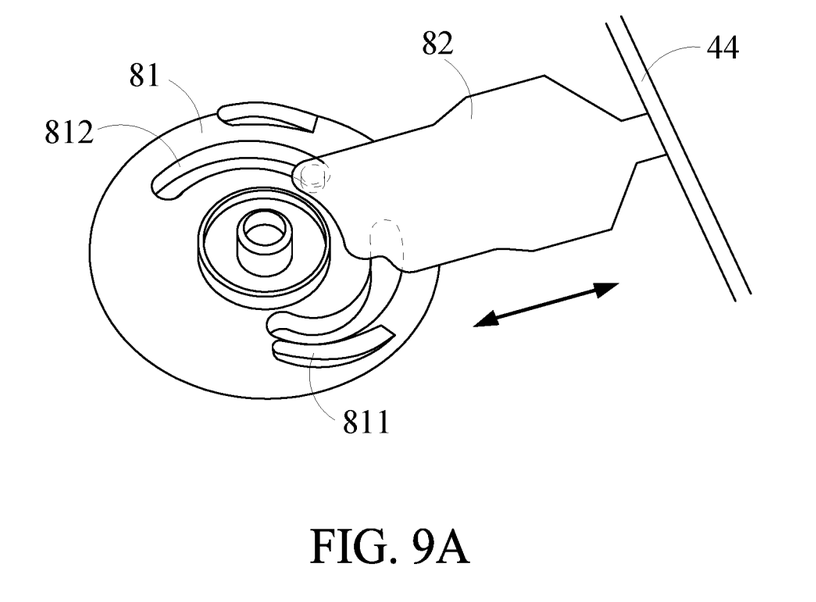
FIG. 9A is a fragmentary view showing a door latching device for the front door of the wafer container according to the preferred embodiment of the present disclosure.
Figure 10A:
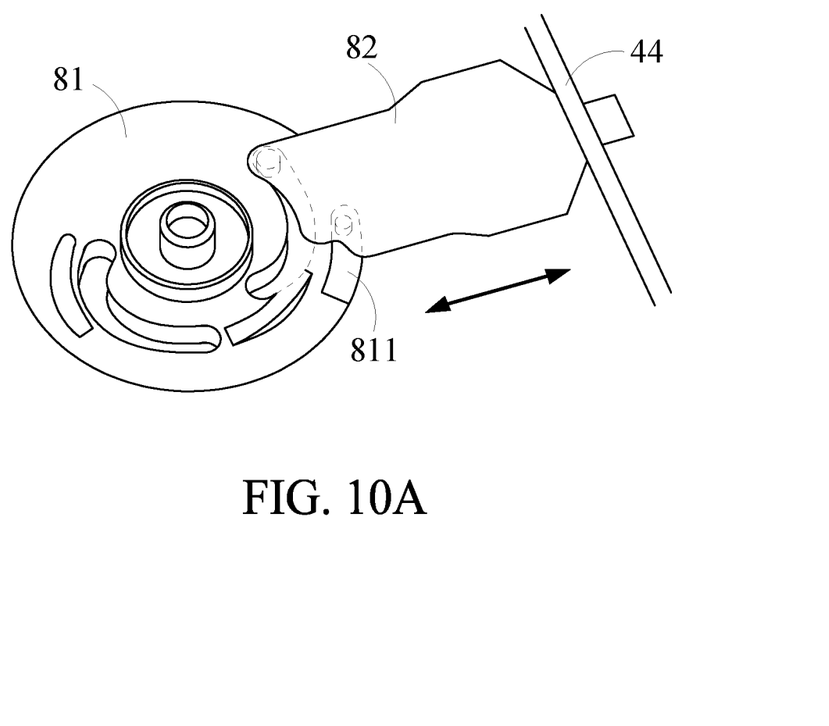
FIG. 10A shows the door latching device of FIG. 9A in a latched state.

More specifically, as shown in FIGS. 9A and 10A, every latch 82 has a distal end facing toward the top panel 41, the bottom panel 42 or the side wall 44 that is located adjacent to the front door 43 and a proximal end slidably connected to a slide groove 812 formed on the cam 81. When the cam 81 is driven to rotate by an externally applied force, the proximal end of the latch 82 slides in along the slide groove 812. It is noted a distance of the slide groove 812 relative to a center of the cam 81 varies gradually, and therefore, the latch 82 retracts or extends relative to the rotating cam 81 to interfere with panel that is located adjacent to the front panel 43. Every door latching device 8 can simultaneously interfere with two panels located adjacent to the front door 43. When the front door 43 is provided with four door latching devices 8, all four sides of the front door 43 can be firmly locked to or unlocked from the top panel 41, the bottom panel 42 and the side panels 44.

Figure 9B:
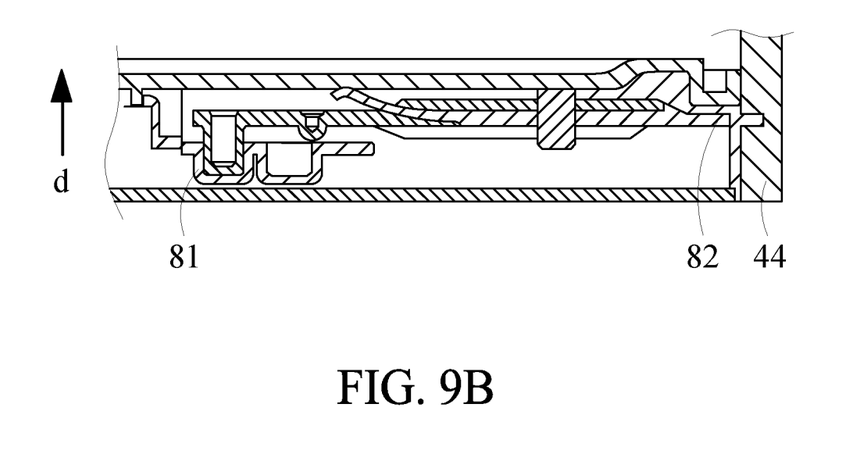
FIG. 9B is a fragmentary sectional view showing the door latching device for the front door of the wafer container according to the preferred embodiment of the present disclosure.
Figure 10B:
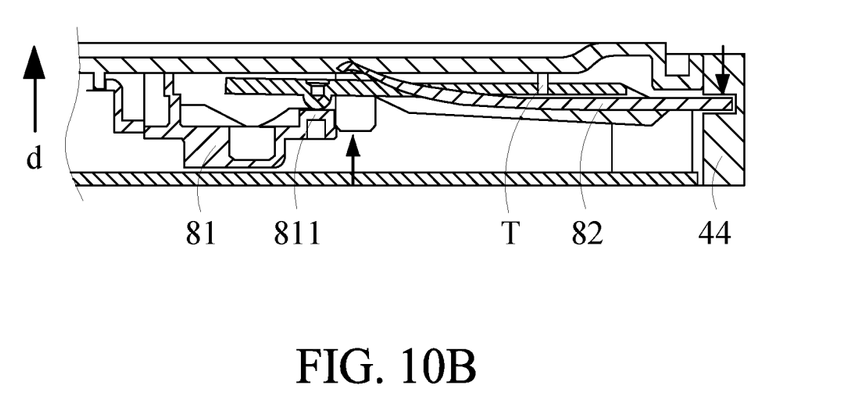
FIG. 10B shows the door latching device of FIG. 9B in a latched state.

In the illustrated preferred embodiment, the cam 81 has at least one protruded section 811. When the cam 81 rotates, for example, from a position shown in FIGS. 9A and 9B to another position shown in FIGS. 10A and 10B, the protruded section 811 lifts and presses against the proximal end of the latch 82 that is connected to the cam 81. Meanwhile, there is a fulcrum T provided between the front door 43 and a middle portion of the latch 82. The fulcrum T together with the protruded section 811 brings the distal end of the latch 82 that faces toward the panel (which is the side panel 44 in FIGS. 9A, 9B, 10A and 10B) that is located adjacent to the front door 43 to shift in an opposite direction, as indicated by the right arrow in FIG. 10B. Since a total weight of the front door 43 and all the door latching devices 8 is smaller than that of all other parts of the container body 4, the distal end of the latch 82 that shifts to push and press against the side panel 44 will physically pulls the front door 43 backward to the container body 4. Further, in the illustrated preferred embodiment, since the engaging direction d is directed from the opening of the container body 4 to the interior thereof, the backward pulled front door 43 is actually moved in the engaging direction d to be tightly closed to other parts of the container body 4. In other words, when the latch 82 interferes with the panel located adjacent to the front door 43 and moves into a locked position, the provision of the protruded sections 811 enables the front door 43 to be more tightly closed onto the opening of the container body 4, so that external moisture or duct is prevented from invading into the container body 4.

While the present disclosure has been described by means of a specific embodiment, numerous modifications and variations could be made thereto by persons skilled in the art without departing from the scope and spirit of the present disclosure set forth in the claims.

What is claimed is:

1. A supporting shelf module, comprising:
a plurality of supporting plates being parallelly arranged in a height direction;
at least one pair of connectors being located at two opposite ends of the supporting plates in the height direction;
an embedded metal part being a hollow member and extending through the supporting plates, and the at least one pair of connectors being two ends of the embedded metal part; and
at least one metal post being axially extended through the embedded metal part;
wherein the supporting plates are made of a plastic material, the at least one pair of connectors are made of a metal material, and the at least one pair of connectors are located correspondingly in a horizontal plane that is perpendicular to the height direction.

2. The supporting shelf module according to claim 1, wherein the at least one pair of connectors include a male connector and a female connector; and the male and the female connector being corresponding in shape.

3. The supporting shelf module according to claim 1, wherein each of the supporting plates has a rib provided on each of two opposite ends thereof.

4. A wafer container, comprising:
a container body;
at least two sets of the supporting shelf modules according to claim 1; the supporting shelf modules being separately mounted in the container body and located adjacent to two opposite side panels of the container body;
at least two top retaining brackets being separately provided on an inward side of a top panel of the container body; each of the two top retaining brackets having a sideward opening; and upper ends of the supporting shelf modules being moved in an engaging direction to engage with the top retaining brackets; and
at least two bottom retaining grooves being separately provided on an inward side of a bottom panel of the container body; and lower ends of the supporting shelf modules being moved in the engaging direction to engage with and be limited to the bottom retaining grooves.

5. The wafer container according to claim 4, wherein the bottom retaining grooves respectively have a width that gradually reduces in the engaging direction.

6. The wafer container according to claim 4, wherein the top retaining brackets respectively have two elastically outward extended wing portions; and the two wing portions defining the sideward opening between them.

7. The wafer container according to claim 4, further comprising four sets of door latching devices provided on a front door of the container body; each set of the door latching device including a cam and two latches; the two latches being located perpendicular to each other and respectively having an end in contact with the cam and another end interfered with the top panel, the bottom panel or one of the two side panels of the container body.

8. The wafer container according to claim 7, wherein the cam has at least one protruded section; and the protruded section lifting and pressing against the end of the latch that is in contact with the cam, such that the latch is brought to turn pivotally.

* * * * *